(12) United States Patent
Kwon et al.

(10) Patent No.: US 12,446,384 B2
(45) Date of Patent: Oct. 14, 2025

(54) DISPLAY DEVICE

(71) Applicant: Samsung Display Co., Ltd., Yongin-Si (KR)

(72) Inventors: Seung Wook Kwon, Hwaseong-si (KR); Woo Yong Sung, Seoul (KR); Seo Yeon Lee, Namyangju-si (KR); Seung Gun Chae, Hwaseong-si (KR); Seung-Yeon Chae, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 436 days.

(21) Appl. No.: 17/858,726

(22) Filed: Jul. 6, 2022

(65) Prior Publication Data

US 2023/0082985 A1    Mar. 16, 2023

(30) Foreign Application Priority Data

Sep. 14, 2021  (KR) .......................... 1020210122328

(51) Int. Cl.
*H10H 20/858* (2025.01)
*H10H 20/01* (2025.01)

(52) U.S. Cl.
CPC ........ *H10H 20/8581* (2025.01); *H10H 20/01* (2025.01); *H10H 20/8582* (2025.01); *H10H 20/0365* (2025.01)

(58) Field of Classification Search
CPC ......... H01L 25/0753; H01L 2933/0075; H01L 33/005; H01L 33/641; H01L 33/642
See application file for complete search history.

(56) References Cited

U.S. PATENT DOCUMENTS

| | | | |
|---|---|---|---|
| 2006/0035085 A1* | 2/2006 | Ozaki | C04B 35/63468 428/408 |
| 2012/0206031 A1* | 8/2012 | Hiroki | H10K 50/87 313/504 |
| 2016/0204366 A1 | 7/2016 | Zhang et al. | |
| 2016/0226024 A1* | 8/2016 | Park | H10K 77/111 |
| 2017/0365760 A1* | 12/2017 | Ruan | H01L 33/641 |
| 2019/0130796 A1* | 5/2019 | Kang | H05K 7/20954 |
| 2021/0384457 A1* | 12/2021 | Jang | H10K 59/8794 |

FOREIGN PATENT DOCUMENTS

| | | |
|---|---|---|
| JP | 2008-9408 A | 1/2008 |
| JP | 2018-116079 A | 7/2018 |
| KR | 10-1399980 B1 | 5/2014 |
| KR | 10-2018-0130030 A | 12/2018 |
| KR | 10-2021-0016231 A | 2/2021 |
| KR | 10-2021-0061604 A | 5/2021 |

* cited by examiner

*Primary Examiner* — Matthew C Landau
*Assistant Examiner* — Dmitriy Yemelyanov
(74) *Attorney, Agent, or Firm* — Innovation Counsel LLP

(57) ABSTRACT

A display device according to an embodiment includes a substrate including a plurality of holes including a hole, a metal layer disposed on one side of the substrate, a light-emitting device layer disposed on the metal layer, and a heat radiation layer disposed on another side of the substrate. The heat radiation layer contacts the metal layer in the hole.

10 Claims, 6 Drawing Sheets

DISPLAY DEVICE

CROSS-REFERENCE TO RELATED APPLICATION

This application claims priority to and the benefit of Korean Patent Application No. 10-2021-0122328 filed in the Korean Intellectual Property Office on Sep. 14, 2021, the entire contents of which are incorporated herein by reference.

BACKGROUND

(A) Technical Field

The present disclosure relates to a display device, and particularly relates to a display device with improved radiation performance.

(B) Description of the Related Art

Importance of flat panel displays (FPD) is increasing as multimedia are developed. Various types of flat panel displays such as a liquid crystal display (LCD) or a light emitting display device are put to practical use.

From among the types of flat panel displays, the light emitting display device is replacing the liquid crystal display that was widely used in the past. The light emitting display device self-generates light and displays images, so differing from the liquid crystal display, the light emitting display device needs no backlight unit for generating light with constituent elements. Therefore, the light emitting display device is more advantageous in reducing the thickness than the liquid crystal display, and its response characteristic is excellent, so its use range is increasing as a next-generation display device.

Regarding the light emitting display device, an emission layer of a light emitting diode (LED) is made of an organic material that is weak to heat. Thus, the organic material is easily degraded by the heat generated from the display panel and the driving circuit substrate, and its lifespan may be reduced. Accordingly, there is a need to discharge the heat generated inside the light emitting display device to the outside.

The above information disclosed in this Background section is only for enhancement of understanding of the background of the inventive concept, and therefore it may contain information that does not form the prior art that is already known in this country to a person of ordinary skill in the art.

SUMMARY

Embodiments have been made in an effort to provide a display device with excellent heat radiation performance.

An embodiment provides a display device including a substrate including a plurality of holes including a hole, a metal layer disposed on one side of the substrate, a light-emitting device layer disposed on the metal layer, and a heat radiation layer disposed on another side of the substrate. The heat radiation layer contacts the metal layer in the hole.

The heat radiation layer may include a first portion disposed in the hole and a second portion disposed on the substrate and the first portion, and the first portion and the second portion may be connected to each other.

The substrate may include glass.

The heat radiation layer may include a polymer resin and heat radiation particles. The heat radiation particles may be at least one of copper, carbon nanotubes (CNT), graphene oxide (GO), and graphite.

A content of the heat radiation particles in the heat radiation layer may be 1 wt % to 80 wt %.

The polymer resin may include at least one of acrylate, polyurethane, and polyethylene.

A ratio of an area in which the holes are disposed to an entire area of the substrate may be 5% to 90%.

The substrate may include a bending area and a non-bending area, and the holes may be disposed in the bending area.

The holes may be disposed to be linear.

The holes may have a polygonal or circular shape.

The metal layer may include chromium or titanium, and the metal layer may overlap a front side of the substrate.

An embodiment provides a display device including a substrate including a plurality of grooves including a groove, a light-emitting device layer disposed on one side of the substrate, and a heat radiation layer disposed on another side of the substrate. The heat radiation layer includes a first portion disposed in the groove and a second portion disposed on the substrate and the first portion.

A thickness of the substrate of a region in which the grooves are disposed may be less than a thickness of the substrate of a region in which the grooves are not disposed.

A ratio of an area in which the grooves are disposed to an entire area of the substrate may be 5% to 90%.

An embodiment provides a display device including a substrate, a light-emitting device layer disposed on one side of the substrate, a pattern layer disposed on another side of the substrate and including a plurality of patterns spaced from each other, and a heat radiation layer disposed on the pattern layer. The heat radiation layer includes a first portion disposed between the patterns and contacting lateral sides of the patterns and a second portion disposed on the substrate and the first portion.

The substrate may include a polyimide.

The pattern layer may include a polymer resin.

The first portion may be connected to the second portion.

An embodiment provides a method for manufacturing a display device including forming a metal layer on one side of a substrate, disposing a mask on another side of the substrate, forming a hole by etching the substrate using the mask, forming a first portion of a heat radiation layer in the hole; and forming a second portion of the heat radiation layer on the substrate and the first portion.

An embodiment provides a method for manufacturing a display device including forming a pattern layer on which a plurality of patterns are spaced from each other on one side of a substrate by using a polymer resin, forming a first portion of a heat radiation layer between the patterns, and forming a second portion of the heat radiation layer on the pattern layer and the first portion.

According to the embodiments, the excellent display device with excellent heat radiation performance is provided.

DETAILED DESCRIPTION OF THE EMBODIMENTS

The inventive concept will be described more fully hereinafter with reference to the accompanying drawings, in which embodiments are shown. As those skilled in the art would realize, the described embodiments may be modified in various different ways, all without departing from the spirit or scope of the inventive concept.

The drawings and description are to be regarded as illustrative in nature and not restrictive, and like reference numerals designate like elements throughout the specification.

The size and thickness of each configuration shown in the drawings are arbitrarily shown for better understanding and ease of description. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or above the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment will now be described with reference to accompanying drawings.

Figure 1:
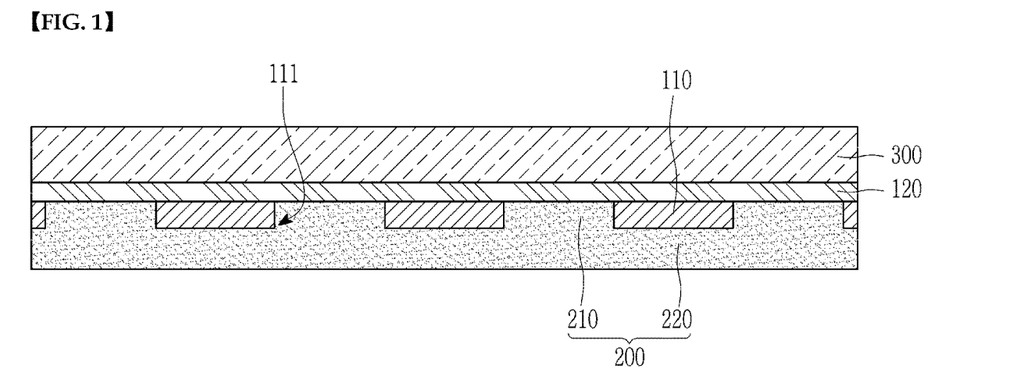
FIG. 1 shows a cross-sectional view of a display device according to an embodiment.

FIG. 1 shows a cross-sectional view of a display device according to an embodiment. Referring to FIG. 1, the display device includes a substrate 110, a metal layer 120 positioned on the substrate, a device layer 300 positioned on the metal layer 120, and a heat radiation layer 200 positioned on another side of the substrate 110. The device layer 300 may include a plurality of thin film transistors, a plurality of light-emitting devices connected to the thin film transistors, and an encapsulation layer for covering the thin film transistors and the light-emitting device, and it displays images by emitting light.

Referring to FIG. 1, a plurality of holes 111 may be positioned in the substrate 110. The heat radiation layer 200 may fill the hole 111 and may contact the metal layer 120.

The device layer 300 discharges heat when it is operated, so it needs the heat radiation layer 200 for outputting the heat to the outside of the display device. When the heat generated by the device layer 300 is not appropriately discharged to the outside, the transistor(s) included in the device layer 300 may be damaged or malfunction by overheating of the device layer 300.

The substrate 110 may include glass. Glass has low thermal conductivity, so the substrate 110 including glass may not efficiently radiate heat.

However, in the case of the display device according to the present embodiment, the holes 111 are positioned in the substrate 110, and the heat radiation layer 200 is positioned in the holes 111. Although one hole 111 of the holes 111 is sometimes discussed herein, it is to be understood that the discussion is equally applicable to all of the holes 111 and associated structures. The heat radiation layer 200 may be positioned in the hole 111 of the substrate 110 and on a front of the substrate 110 and may efficiently discharge the heat generated by the device layer 300. The heat radiation layer 200 may include a first portion 210 positioned in the hole 111 and a second portion 220 positioned outside the hole 111. The first portion 210 and the second portion 220 may be integrally connected to each other.

The heat radiation layer 200 may be made of a polymer resin including heat radiation particles. In detail, the polymer resin of the heat radiation layer 200 may be an acrylate-based resin. The acrylate-based resin signifies a resin including acrylate in the structure. The acrylate-based resin may further include a structure such as polyurethane or polyethylene. The polyurethane and the polyethylene are supplementary materials for allowing the heat radiation layer 200 to have elasticity, and they may protect the display device without forming an additional cushion layer. The resin of the heat radiation layer 200 may be hardened by irradiation of UV rays.

The heat radiation particles may be at least one of copper, carbon nanotubes (CNT), graphene oxide (GO), and graphite. The heat radiation particles may be nanoparticles in a nano-size. A content of the heat radiation particles in the heat radiation layer 200 may be 1 wt % to 80 wt %. When the content of the heat radiation particles is less than 1 wt %, they may have insufficient heat radiation performance. When the content of the heat radiation particles is greater than 80 wt %, the heat radiation layer 200 may not be well adhered to the substrate 110.

The holes 111 may be formed in the entire side of the display device, and may be formed in a bending area of the display device. For example, a ratio of an area of the region in which the holes 111 are formed to an entire area of the substrate 110 of the display device may be 5% to 90%. When the area of the region in which the holes 111 are formed is less than 5%, heat radiation slay not be efficiently performed. When the area of the region in which the holes 111 are formed is greater than 90%, rigidity of the substrate 110 is reduced and the display device may not be efficiently supported.

Referring to FIG. 1, the metal layer 120 positioned on the substrate 110 may function as an edge stopper in a process for etching the hole 111 of the substrate 110. That is, the metal layer 120 may prevent the device layer 300 from being etched in the etching process for forming the hole 111 in the substrate 110. The metal layer 120 may include chromium or titanium. The metal layer 120 is made of a metal and has an excellent thermal conductivity characteristic, so it may efficiently transmit the heat generated by the device layer 300 to the heat radiation layer 200.

Figure 2:
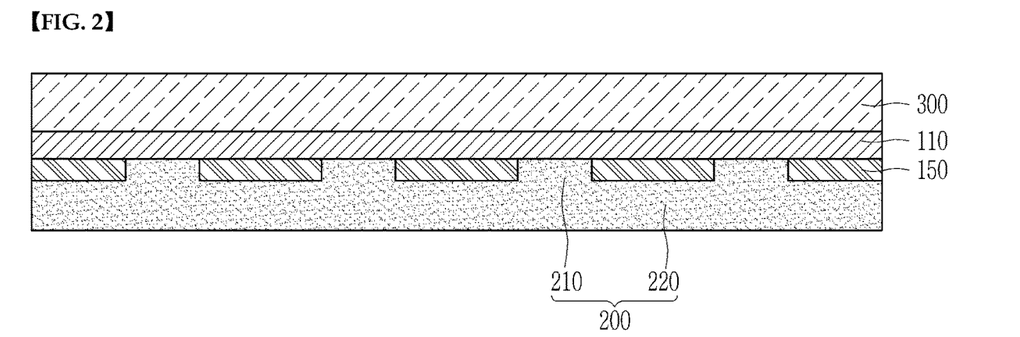
FIG. 2 shows a same cross-sectional view as FIG. 1, regarding a display device according to an embodiment.

FIG. 1 shows the display device when the substrate 110 includes glass, but the substrate 110 may include a polyimide rather than the glass. FIG. 2 shows a same cross-sectional view as FIG. 1, regarding a display device according to an embodiment.

Referring to FIG. 2, the substrate 110 includes a polyimide and not glass. The substrate 110 including a polyimide may not include an additional hole 111 as in the embodiment of FIG. 1. A pattern layer 150 may be positioned on one side of the substrate 110. The pattern layer 150 may include a plurality of patterns spaced from each other, as shown in FIG. 2. A heat radiation layer 200 is positioned in the pattern layer 150 and a spaced region of the pattern layer 150. The heat radiation layer 200 may include a first portion 210 positioned in the spaced region of the pattern layer 150 and contacting lateral sides of the patterns and a second portion 220 positioned on the pattern layer 150. The first portion 210 and the second portion 220 may be integrally connected to each other.

That is, in the case of an embodiment described with reference to FIG. 2, while no hole is formed in the substrate 110, the pattern layer 150 may be additionally positioned, and the heat radiation layer 200 is positioned within the pattern layer 150. Descriptions on other constituent elements correspond to what is described with reference to FIG. 1 so they will be omitted.

Referring to FIG. 2, the pattern layer 150 may be made by an inkjet method by use of a polymer resin. In detail, the pattern layer 150 may include a polysiloxane-based acrylate. However, the pattern layer 150 may include various types of resins made by the inkjet method.

The heat radiation layer 200 may be positioned in the spaced region and the front side of the pattern layer 150 and may receive heat generated by the device layer 300.

FIG. 1 and FIG. 2 show a configuration in which the hole 111 or the pattern layer 150 is formed in/on the entire display device, but the hole 111 and the pattern layer 150 may be formed in a predetermined region of the display device.

Figure 3:
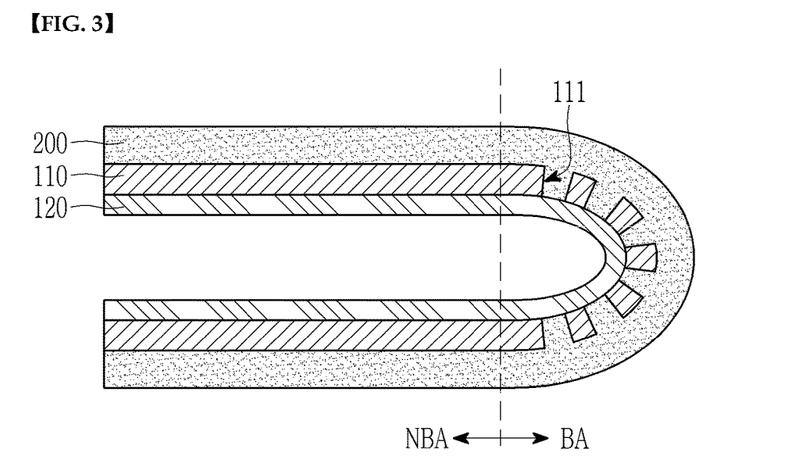
FIG. 3 shows a metal layer, a substrate, and a heat radiation layer in a foldable display device.

FIG. 3 shows a metal layer 120, a substrate 110, and a heat radiation layer 200 in a foldable display device. As shown in FIG. 3, the substrate 110 may include the hole 111 positioned in a bending area BA, and may include no hole 111 in a non-bending area NBA. When the substrate 110 includes the hole 111 in the bending area BA, it may be bent. That is, the substrate 110 including glass is not easily bent, but it will be well bent when the bending area BA, sometimes called the bending portion BA, includes the hole 111 as shown in FIG. 3. The heat radiation layer 200 filled in the hole 111 includes a polyurethane or a polyethylene and has elasticity so it is easily bent.

This is however an example, and holes 111 may be formed in the non-bending area NBA. When the display device is a rollable display device, the holes 111 may be formed in the entire region.

Figure 4:
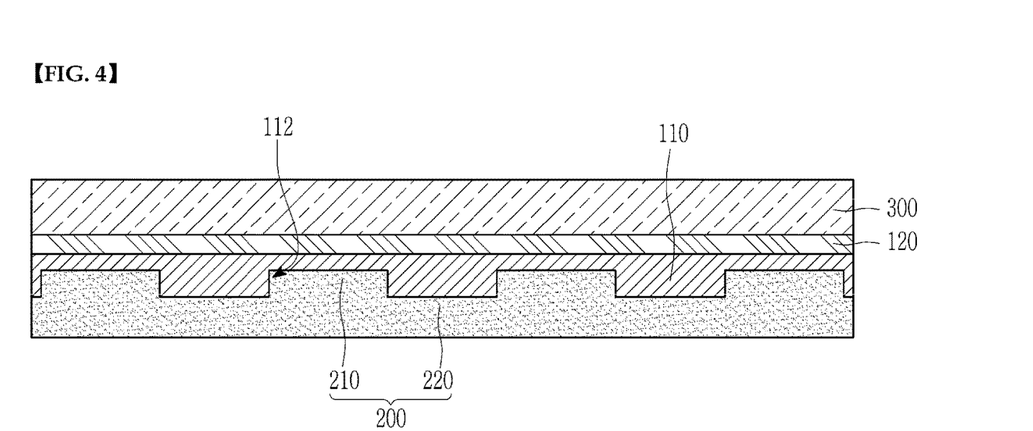
FIG. 4 shows a same cross-sectional view as FIG. 1 according to an embodiment.

FIG. 1 and FIG. 3 show that the heat radiation layer 200 contacts the metal layer 120 in the hole 111 of the substrate 110, but the heat radiation layer 200 may not directly contact the metal layer 120 in an embodiment. FIG. 4 shows a same cross-sectional view as FIG. 1 according to an embodiment. Referring to FIG. 4, regarding the display device according to the present embodiment, the substrate 110 includes grooves 112 instead of holes 111. Although one groove 112 of the grooves 112 is sometimes discussed herein, it is to be understood that the discussion is equally applicable to all of the grooves 112 and associated structures. The hole 111 shown in FIG. 1 penetrates the substrate 110 while the groove 112 shown in FIG. 4 does not penetrate the substrate 110. That is, the groove 112 signifies the region of the substrate 110 that is not completely etched but partly remains.

According to an embodiment described with reference to FIG. 4, the heat radiation layer 200 includes a first portion 210 positioned in the groove 112 and a second portion 220 for covering a front side of the substrate 110. In this case, heat radiation performance may be increased in a similar way to an embodiment described with reference to FIG. 1. The substrate 110 is thin in the region in which the groove 112 is positioned, so the heat may be well transmitted to the heat radiation layer 200 compared to the region in which the groove 112 is not positioned. Descriptions on other constituent elements correspond to what is described with reference to FIG. 1 so they will be omitted.

Figure 5:
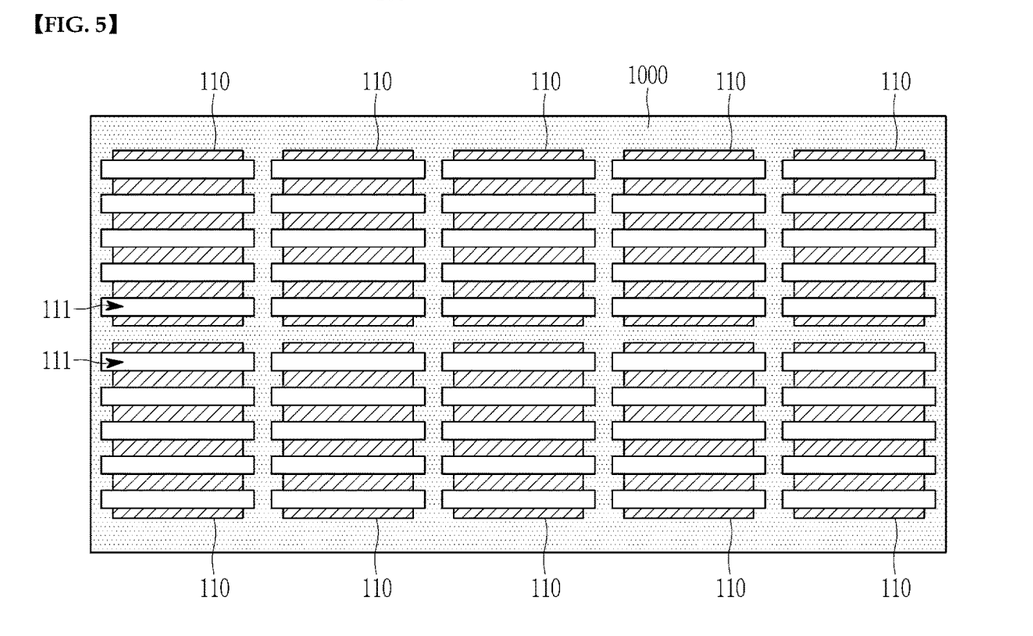
FIG. 5 shows a region in which holes are formed in a mother substrate including a plurality of substrates.

FIG. 5 shows a region in which holes 111 are formed in a mother substrate 1000 including a plurality of substrates 110. As shown in FIG. 5, the holes 111 may be formed in parallel in one direction. This is however an example, and the holes 111 may have various shapes.

Figure 6:
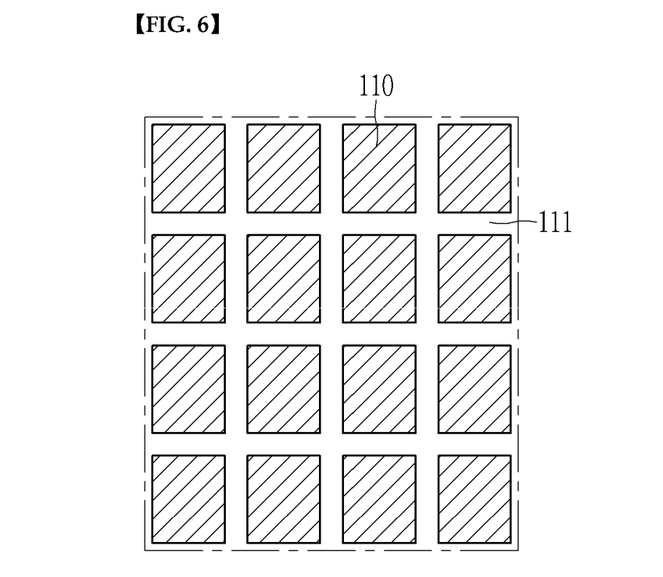
FIG. 6 shows holes in a substrate according to an embodiment.

FIG. 6 shows holes 111 in a substrate 110 according to an embodiment. Referring to FIG. 6, regarding the display device according to the present embodiment, the holes 111 of the substrate 110 have lattice shapes. In this case, the holes 111 may more quickly discharge heat than the case when they are positioned in one direction.

Figure 7:
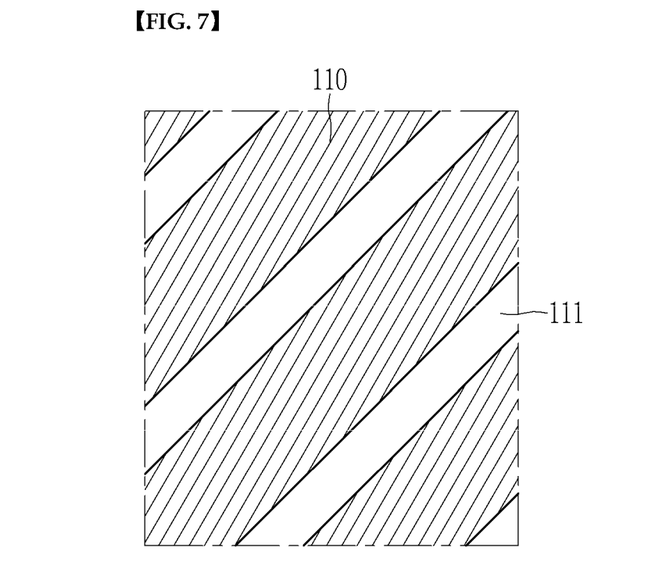
FIG. 7 shows holes in a substrate according to an embodiment.

FIG. 7 shows holes 111 in a substrate 110 according to an embodiment. Referring to FIG. 7, regarding the display device according to the present embodiment, the holes 111 may be positioned in a diagonal direction in the substrate 110. A formation direction of the holes 111 is variable depending on a bending direction of the display device.

Figure 8:
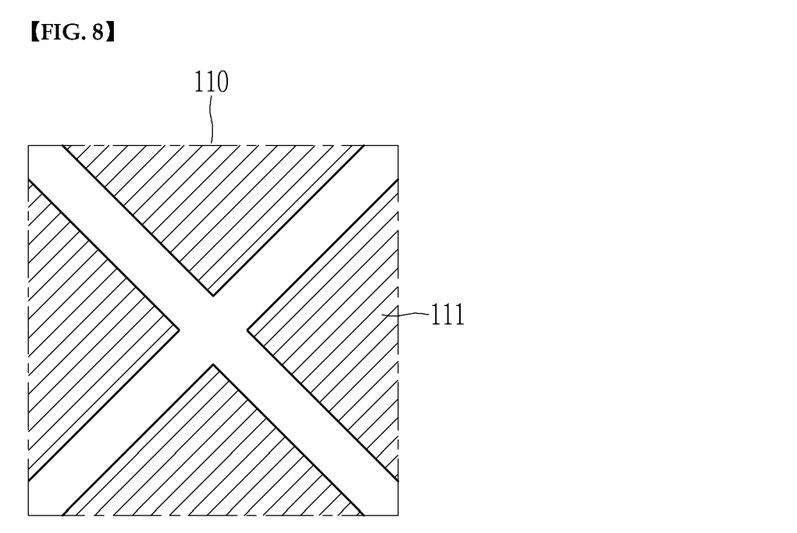
FIG. 8 shows holes in a substrate according to an embodiment.

FIG. 8 shows holes 111 in a substrate 110 according to an embodiment. Referring to FIG. 8, regarding the display device according to the present embodiment, the holes 111 may be positioned in an x-shape in the substrate 110.

Figure 9:
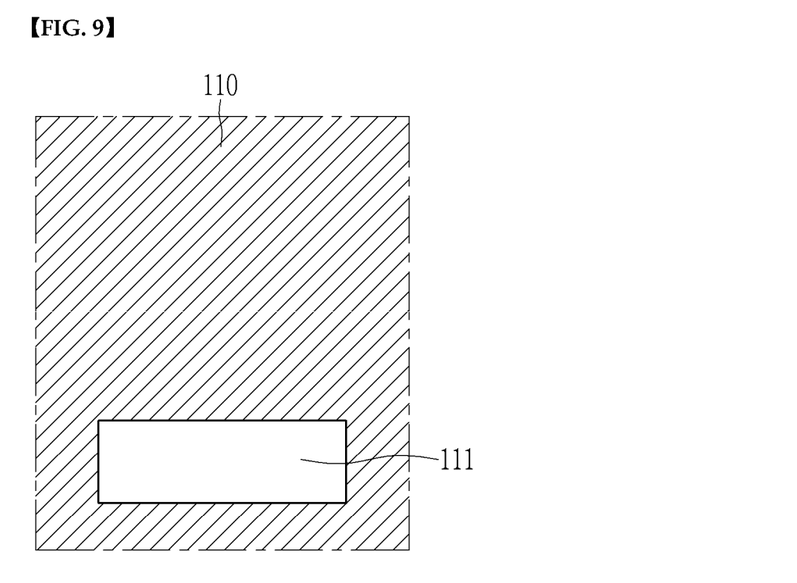
FIG. 9 shows holes in a substrate according to an embodiment.

FIG. 9 shows holes 111 in a substrate 110 according to an embodiment. Referring to FIG. 9, regarding the display device according to the present embodiment, the hole 111 is formed to be a total plate in a predetermined region of the substrate 110. The hole 111 of the substrate 110 may overlap a portion that generates much heat from among the display device. For example, they may overlap a portion through which a plurality of wires pass or a portion in which a pad is positioned from among the display device. When the hole 111 is formed in a portion that generates much heat, the heat may be efficiently discharged. The hole 111 is illustrated to be a polygon in FIG. 9, but it may be a circle or an oval.

Various shapes of the hole 111 are described with reference to FIG. 5 to FIG. 9, which is however an example. The hole 111 may occupy 5% to 90% of the entire area of the substrate 110, and its shape may be various.

A method for manufacturing a display device according to the present embodiment will now be described with reference to drawings. FIG. 10 to FIG. 13 show processing cross-sectional views of a process for manufacturing the display device of FIG. 1.

Figure 10:
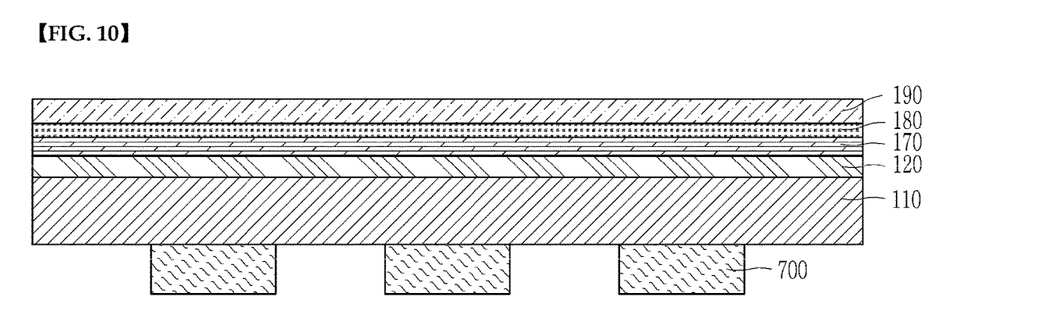
FIGS. 10, 11, 12, and 13 show processing cross-sectional of a process for manufacturing the display device of FIG. 1.

Referring to FIG. 10, a mask 700 is positioned on one side of the substrate 110. A metal layer 120 may be positioned on another side of the substrate 110. The metal layer 120 may include copper or titanium, and may function as an edge stopper in an etching process. A light-emitting device layer 170 may be positioned on the metal layer 120. The light-emitting device layer 170 may include a plurality of thin film transistors and a light-emitting device connected to the thin film transistors. An encapsulation layer 180 may be positioned on the light-emitting device layer 170. The encapsulation layer 180 may have a structure in which an organic film and an inorganic film are alternately stacked, and may protect the light-emitting device layer 170 from external moisture. A touch sensing layer 190 may be positioned on encapsulation layer 180. The touch sensing layer 190 may be omitted depending on embodiments.

The mask 700 may be made of an organic material. In detail, the mask 700 may be formed by coating an epoxy resin. A thickness of the mask 700 may be 10 μm to 900 μm. The mask 700 is first etched when the substrate 110 is etched, and the thickness of the mask 700 may be appropriately adjusted according to the thickness of the substrate 110 and a depth of the hole 111 to be formed.

Figure 11:
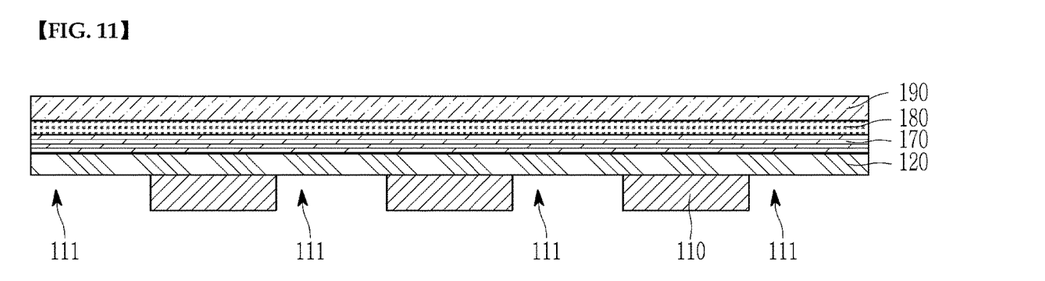

Referring to FIG. 11, the substrate 110 is etched. In this instance, the substrate 110 may be wet etched by using an etchant such as hydrofluoric acid. The mask 700 is first etched in the region in which the mask 700 is positioned, and the region in which no mask 700 is positioned is etched to form the hole 111. Referring to FIG. 11, as the metal layer 120 may function as an edge stopper, the substrate 110 is etched, and the metal layer 120 or other layers on the metal layer 120 are not etched.

Figure 12:
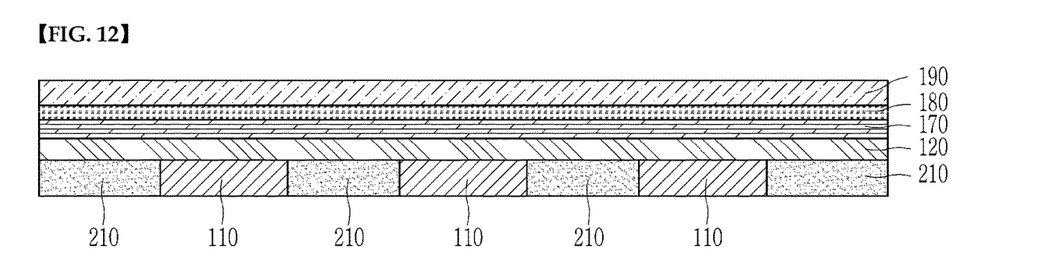

Referring to FIG. 12, the heat radiation layer 200 is coated on the hole 111 for a first time, e.g., in a first coating operation, to form a first portion 210. The heat radiation layer 200 has already been described above. That is, the heat radiation layer 200 may be made of a resin including heat radiation particles. The resin may be an acrylate-based resin, and the heat radiation particles may be at least one of copper, carbon nanotubes (CNT), graphene oxide (GO), and graphite.

By the first coating of the heat radiation layer 200, the hole 111 is filled, and one side of the substrate 110 becomes flattened.

Figure 13:
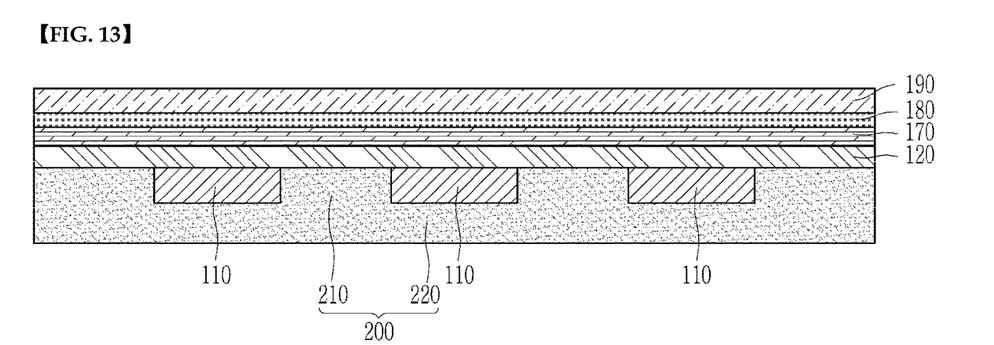

Referring to FIG. 13, a second portion 220 is formed by coating the heat radiation layer 200 for a second time, e.g., in a second coating operation. In this instance, the second portion 220 of the heat radiation layer 200 is uniformly coated on the substrate 110 and the front side of the hole 111 filled with the heat radiation layer 200. The second portion 220 of the heat radiation layer 200 contacts the formed first portion 210 and is connected to the same.

Figure 14:
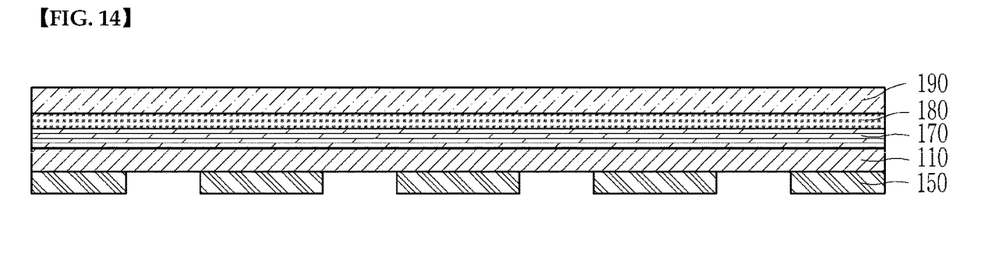
FIGS. 14, 15 and 16 show processing cross-sectional views of a process for manufacturing the display device of FIG. 2.
Figure 15:
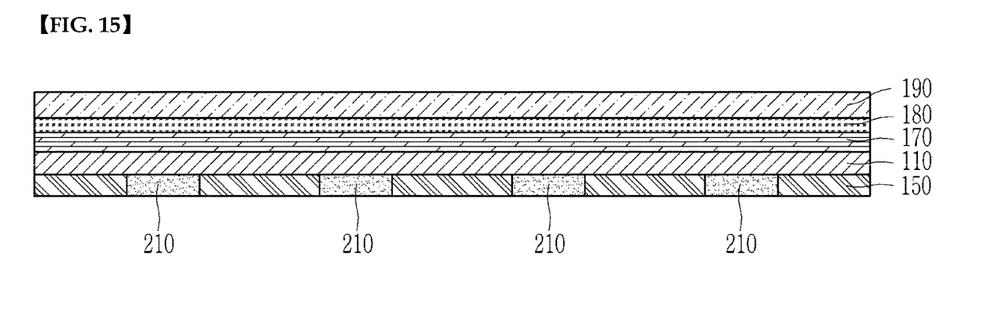
Figure 16:
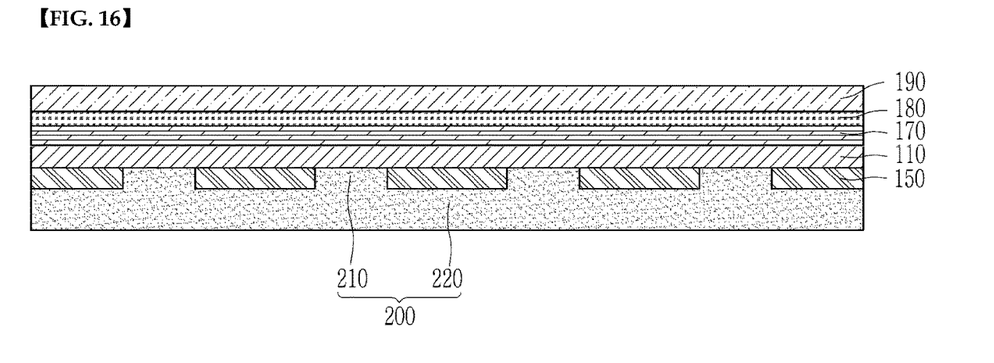

FIG. 14 to FIG. 16 show processing cross-sectional views of a process for manufacturing the display device of FIG. 2.

Referring to FIG. 14, a pattern layer 150 is formed on one side of the substrate 110. Descriptions on the light-emitting device layer 170, the encapsulation layer 180, and the touch sensing layer 190 positioned on another side of the substrate 110 correspond to what is described with reference to FIG. 10 so they will be omitted.

The pattern layer 150 may be made by the inkjet method by use of a resin. In detail, the pattern layer 150 may be made of a polysiloxane-based acrylate, and may be formed by the inkjet method. As shown in FIG. 14, the pattern layer 150 may be multiple patterns to be spaced from each other to define holes, sometimes called spaced regions, between the patterns. Although one spaced region of the spaced regions of the pattern layer 150 is sometimes discussed herein, it is to be understood that the discussion is equally applicable to all of the spaced regions and associated structures.

Referring to FIG. 15, the first portion 210 is formed by coating the heat radiation layer 200 on the spaced region of the pattern layer 150 for the first time. The heat radiation layer 200 has already been described above. That is, the heat radiation layer 200 may be made of a resin including heat radiation particles. The resin may be an acrylate-based resin, and the heat radiation particles may be at least one of copper, carbon nanotubes (CNT), graphene oxide (GO), and graphite.

By the first coating of the heat radiation layer 200, the spaced region of the pattern layer 150 is filled, and the pattern layer 150 may have a planar surface.

Referring to FIG. 16, the second portion 220 is formed by coating the heat radiation layer 200 for the second time. In this instance, the second portion 220 of the heat radiation layer 200 is uniformly coated on the pattern layer 150 and the front side of the first-coated heat radiation layer 200. The second portion 220 contacts the first portion 210 and is connected to the same.

While the inventive concept has been described in connection with what is presently considered to be practical embodiments, it is to be understood that the inventive concept is not limited to the disclosed embodiments, but, on the contrary, is intended to cover various modifications and equivalents included within the spirit and scope of the appended claims.

<Description of symbols>

| | |
|---|---|
| 1000: mother substrate | 110: substrate |
| 111: hole | 112: groove |
| 120: metal layer | 150: pattern layer |
| 170: light-emitting device layer | 180: encapsulation layer |
| 190: touch sensing layer | 200: heat radiation layer |
| 210: first portion | 220: second portion |
| 300: device layer | BA: bending area |
| NBA: non-bending area | |

What is claimed is:

1. A display device comprising:
   a substrate including a plurality of holes comprising a hole, wherein
   the holes are disposed to be linear in a plan view of the substrate;
   a metal layer disposed on one side of the substrate;
   a light-emitting device layer disposed on the metal layer; and
   a heat radiation layer disposed on another side of the substrate,
   wherein the heat radiation layer contacts the metal layer in the hole.

2. The display device of claim 1, wherein
   the heat radiation layer includes a first portion disposed in the hole and a second portion disposed on the substrate and the first portion, and
   the first portion and the second portion are connected to each other.

3. A display device comprising:
   a substrate including a plurality of holes comprising a hole;
   a metal layer disposed on one side of the substrate;
   a light-emitting device layer disposed on the metal layer; and
   a heat radiation layer disposed on another side of the substrate, wherein the heat radiation layer contacts the metal layer in the hole, wherein the substrate consists of glass.

4. The display device of claim 1, wherein
   the heat radiation layer includes a polymer resin and heat radiation particles, and the heat radiation particles are at least one of copper, carbon nanotubes (CNT), graphene oxide (GO), and graphite.

5. The display device of claim 4, wherein
a content of the heat radiation particles in the heat radiation layer is 1 wt % to 80 wt %.

6. The display device of claim 4, wherein
the polymer resin includes at least one of acrylate, polyurethane, and polyethylene.

7. The display device of claim 1, wherein
a ratio of an area in which the holes are disposed to an entire area of the substrate is 5% to 90%.

8. The display device of claim 1, wherein
the substrate includes a bending area and a non-bending area, and
the holes are disposed in the bending area.

9. The display device of claim 3, wherein
the holes have a polygonal or circular shape.

10. The display device of claim 1, wherein
the metal layer includes chromium or titanium, and
the metal layer overlaps a front side of the substrate.

* * * * *